(12) United States Patent
Suzuki et al.

(10) Patent No.: US 8,501,279 B2
(45) Date of Patent: Aug. 6, 2013

(54) FLEXIBLE LAMINATE BOARD, PROCESS FOR MANUFACTURING OF THE BOARD, AND FLEXIBLE PRINT WIRING BOARD

(75) Inventors: Masahiko Suzuki, Chikusei (JP); Kazuhito Obata, Chikusei (JP); Katsuyuki Masuda, Chikusei (JP); Kenichi Tomioka, Chikusei (JP); Masaki Takeuchi, Chikusei (JP); Sumio Yoshida, Chikusei (JP); Hirokazu Suzuki, Chikusei (JP); Yoshitsugu Matsuura, Chikusei (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 942 days.

(21) Appl. No.: 12/091,519

(22) PCT Filed: Oct. 19, 2006

(86) PCT No.: PCT/JP2006/320851
§ 371 (c)(1),
(2), (4) Date: Nov. 21, 2008

(87) PCT Pub. No.: WO2007/049502
PCT Pub. Date: May 3, 2007

(65) Prior Publication Data
US 2009/0081426 A1   Mar. 26, 2009

(30) Foreign Application Priority Data

Oct. 25, 2005 (JP) .............................. P2005-310184
Dec. 7, 2005 (JP) .............................. P2005-353800

(51) Int. Cl.
*B32B 3/10* (2006.01)
*B32B 15/09* (2006.01)
*B05D 3/02* (2006.01)
*B05D 3/10* (2006.01)

(52) U.S. Cl.
USPC ...... 427/377; 427/388.1; 427/97.6; 427/96.1; 427/97.1

(58) Field of Classification Search
USPC ............. 427/96.1, 97.1, 97.6, 98.9, 377, 379, 427/388.1, 209
See application file for complete search history.

(56) References Cited

U.S. PATENT DOCUMENTS 4,725,484 A * 2/1988 Kumagawa et al. .......... 428/220
4,839,232 A   6/1989 Morita et al.
(Continued)

FOREIGN PATENT DOCUMENTS

JP   58-190093   11/1983
JP   60-206639   10/1985
(Continued)

OTHER PUBLICATIONS

Translation of JP 63-69634, Method for Making Flexible Printed Circuit Board, Eikichi Sato, Mar. 29, 1988.*

(Continued)

*Primary Examiner* — George Koch
(74) *Attorney, Agent, or Firm* — Antonelli, Terry, Stout & Kraus, LLP.

(57) ABSTRACT

A process for production of a flexible laminated sheet having one or more laminated bodies each provided with a metal foil formed on one side of a resin film, the process comprising a coating step in which a varnish containing a polyamic acid and a solvent is coated onto the metal foil to form a coated film, a holding step in which the coated film formed on the metal foil is held, a drying step in which at least a portion of the solvent in the varnish is removed to form a layer composed of a resin composition, and a resin film-forming step in which the layer composed of the resin composition is heated to form a resin film containing a polyimide resin. The conditions for each step from the coating step up to the resin film-forming step are adjusted based on a target for the content of metal elements in the resin film.

10 Claims, 5 Drawing Sheets

U.S. PATENT DOCUMENTS

| | | | | |
|---|---|---|---|---|
| 5,077,084 A | * | 12/1991 | Konotsune et al. | 427/99.4 |
| 5,324,810 A | | 6/1994 | Auman | |
| 2006/0042750 A1 | * | 3/2006 | Usuki et al. | 156/307.5 |

FOREIGN PATENT DOCUMENTS

| | | |
|---|---|---|
| JP | 62-208690 | 9/1987 |
| JP | 63-69634 | 3/1988 |
| JP | 01-118527 | 5/1989 |
| JP | 02-206542 | 8/1990 |
| JP | 3-104185 | 5/1991 |
| JP | 3-61351 | 9/1991 |
| JP | 5-228418 | 9/1993 |
| JP | 5-245433 | 9/1993 |
| JP | 2000-186143 | 7/2000 |
| JP | 2001-308474 | 11/2001 |
| JP | 3447070 | 9/2003 |
| JP | 2005-042091 | 2/2005 |
| JP | 2005-44880 | 2/2005 |
| JP | 2005-96251 | 4/2005 |
| JP | 2006-206756 | 8/2006 |
| KR | 10-2005-0008494 | 1/2005 |

OTHER PUBLICATIONS

Translation of the Preliminary Report on Patentability dated May 8, 2008, for Application No. PCT/JP2006/320851.

Taiwanese Official Action issued Aug. 27, 2012, for TW Application No. 095139222.

Korean Official Action dated Nov. 23, 2012, for KR Application No. 10-2012-7005018.

* cited by examiner

FLEXIBLE LAMINATE BOARD, PROCESS FOR MANUFACTURING OF THE BOARD, AND FLEXIBLE PRINT WIRING BOARD

This application is a national stage entry of PCT/JP2006/320851, filed on Oct. 19, 2006.

TECHNICAL FIELD

The present invention relates to a flexible laminated sheet that can be used for manufacture of flexible printed circuit boards, and to a process for its production. The invention further relates to a flexible printed circuit board.

BACKGROUND ART

A flexible printed circuit board is a flexible wiring board with a conductor pattern formed on the surface of an insulating resin film. Flexible printed circuit boards have become common in recent years as means of achieving increased miniaturization and higher density in electronic devices. Most flexible printed circuit boards employ aromatic polyimides as resin films.

Flexible printed circuit boards employing aromatic polyimides have been conventionally manufactured by a process in which, generally, a copper foil is bonded to a polyimide film as the insulating layer using an adhesive such as an epoxy resin or acrylic resin. With flexible printed circuit boards obtained by this process, the level of properties such as heat resistance, chemical resistance, flame retardance, electrical characteristics and adhesiveness depend on the properties of the adhesive used, and therefore it has not been possible to satisfactorily exhibit the excellent properties of aromatic polyimides.

Methods of heat sealing polyimide films to metal foils using thermoplastic polyimides as adhesives have therefore been proposed (Patent documents 1-3). There have also been proposed methods of direct cast coating of a metal foil such as a copper foil with a solution of a polyamic acid (polyimide precursor) having a thermal expansion coefficient equivalent to that of the metal foil, and removing the solvent to produce a high molecular weight product (hereinafter referred to as direct coating methods) (Patent documents 4, 5). There are also known methods of forming metal layers by vapor deposition or sputtering onto polyimide films (Patent document 6).

[Patent document 1] Japanese Unexamined Patent Publication HEI No. 3-104185
[Patent document 2] Japanese Unexamined Patent Publication No. 2005-44880
[Patent document 3] Japanese Unexamined Patent Publication No. 2005-96251
[Patent document 4] Japanese Unexamined Patent Publication SHO No. 58-190093
[Patent document 5] Japanese Unexamined Patent Publication SHO No. 63-69634
[Patent document 6] Japanese Patent Publication No. 3447070

DISCLOSURE OF THE INVENTION

Problems to be Solved by the Invention

With flexible printed circuit boards obtained by conventional production processes including those described in Patent documents 1-6, however, it has been difficult to sufficiently reduce the permittivities of the polyimide films. Consequently, further improvement is desired in terms of the characteristics, and especially dielectric characteristics, of the flexible printed circuit boards.

It is therefore an object of the present invention to provide a process for production of a flexible laminated sheet that can be used to manufacture flexible printed circuit boards that exhibit satisfactory dielectric characteristics, by comprising a resin film containing a polyimide resin with sufficiently reduced permittivity.

The flexible printed circuit boards obtained by conventional production processes have not been adequately resistant to wire breakage caused by peeling of wiring under repeated flexural stress or thermal history. In other words, further improvements in terms of flexible printed circuit board reliability are desired.

For example, the aforementioned flexible printed circuit boards of the prior art which employ thermoplastic polyimides as adhesives do not always exhibit adequate heat resistance by the thermoplastic polyimides, and therefore the resistance to thermal history has been insufficient. The high molding temperature required for heat sealing has also led to problems of increasing complexity of the production equipment. The flexible printed circuit boards obtained by conventional direct coating methods have also often been insufficient from the standpoint of reliability.

On the other hand, sputtering production processes require special equipment for sputtering, and the problem of production step complexity arises when plating and high-temperature heat treatment steps are necessary.

It is therefore another object of the invention to provide a process for production of a flexible laminated sheet that allows production of flexible printed circuit boards with sufficiently high reliability using simple steps.

Means for Solving the Problems

The present inventors have studied the cause of the high permittivity of polyimide films in flexible laminated sheets, from the viewpoint of the elements in the films. As a result, it was discovered that the polyimide films contain metal elements that should be absent from the starting materials for polyimide films. Upon further research, the present inventors found that the metal elements in polyimide films are the same species as the component elements of the adjacent metal foil, and their concentration distribution in the thickness direction decreases from the metal foil side of the polyimide film toward the opposite side.

The present inventors therefore surmised that the content of the metal elements in the polyimide film increases because the metal elements move from the adjacent metal foil into the polyimide film of the flexible laminated sheet (a phenomenon known as "migration"), thus causing an increase in permittivity. As a result of yet further detailed investigation on flexible laminated sheet production processes with the goal of preventing such migration, the present invention was completed.

One aspect of the invention is a process for production of a flexible laminated sheet having one or more laminated bodies each provided with a metal foil formed on one side of a resin film, the process comprising a coating step in which a varnish containing a polyamic acid and a solvent is coated onto the metal foil to form a coated film, a holding step in which the coated film formed on the metal foil is held, a drying step in which at least a portion of the solvent in the varnish is removed to form a layer composed of a resin composition, and a resin film-forming step in which the layer composed of the resin composition is heated to form a resin film containing a polyimide resin, wherein the conditions for each step after the coating step up to the resin film-forming step are adjusted based on a target for the content of metal elements in the resin film.

According to the invention it is possible to sufficiently reduce the permittivity of the resin film containing the polyimide resin which is formed on the flexible laminated sheet, so that a flexible printed circuit board fabricated from the flexible laminated sheet can exhibit satisfactory dielectric characteristics. The present inventors believe the reasons for this effect to be the following. Other factors, however, may be involved.

For conventional fabrication of flexible laminated sheets with polyimide films, the metal foil after coating of the varnish containing the polyamic acid and solvent is usually stored for a certain period of time (for example, 1-2 days) in air at room temperature without active drying of the varnish, from the viewpoint of allowing more flexibility in the production steps. In most cases, this is followed by removal of the solvent in the varnish to form a layer composed of the resin composition, but at times the entire solvent is removed while at other times only a portion of the solvent is removed. In addition, different temperatures and atmospheres are used for the solvent removal. The conditions for curing of the layer composed of the resin composition (for example, the temperature and atmosphere) are adjusted according to the type of polyimide. However, migration of metal elements from the metal foil into the polyimide film is believed to occur because of the acidic polyamic acid in the varnish coated on the metal foil. Specifically, it is conjectured that the polyamic acid dissolves the metal foil and promotes migration of the metal elements in the metal foil into the varnish, thus resulting in inclusion of metal elements into the polyimide film obtained from the varnish.

However the conditions, including the temperature, atmosphere and time for storage, the temperature and atmosphere for removal of the solvent in the varnish, the degree of removal of the varnish and the atmosphere for curing of the resin composition, have not been considered from the viewpoint of the content of metal elements in the polyimide film. The content of metal elements in the polyimide film is therefore affected by the polyamic acid, such that it has not been possible to control the permittivity of the polyimide film sufficiently as desired.

According to the production process of the invention, however, the various conditions for the step after coating of the varnish on the metal foil and for the steps prior to formation of the resin film, such as the holding step and/or drying step, are adjusted based on a target for the content of metal elements in the resin film. This allows the permittivity of the resin film to be sufficiently controlled. A resin film with an adequately reduced permittivity is thus obtained, permitting fabrication of a flexible printed circuit board that exhibits satisfactory characteristics.

According to the invention, the conditions for each of the steps are preferably adjusted so that the content of metal elements in the resin film is no greater than 5 wt %. Investigation by the present inventors has suggested that a content of no greater than 5 wt % for metal elements in the resin film tends to result in a more sufficient permittivity for practical use.

According to the invention, the layer composed of the resin composition is preferably heated in a reducing atmosphere during the resin film-forming step. This allows oxidation of the metal foil to be more effectively prevented, for improved adhesiveness between the metal foil and resin film in the flexible laminated sheet.

Another aspect of the invention is a process for production of a flexible laminated sheet having one or more laminated bodies each provided with a metal foil formed on one side of a resin film, the process comprising a coating step in which a varnish containing a solvent and either a polyimide resin or its precursor is coated onto the metal foil, a drying step in which the solvent in the varnish is removed to a proportion of 1-60 wt % of the total, and a resin film-forming step in which the resin composition layer is heated to 250-550° C. under a reducing atmosphere to form a resin film containing a polyimide resin.

According to this production process of the invention, the varnish is dried until the solvent proportion is within the aforementioned specified range and is then heat treated at a temperature within the aforementioned specified range to produce a polyimide resin, and therefore a flexible laminated sheet that can yield flexible printed circuit boards with sufficiently high reliability can be produced by a simple process.

In the production processes described above, the reducing atmosphere is preferably one formed by a mixed gas composed of nitrogen gas with hydrogen gas at between 0.1 vol % and 4 vol % of the total. This will more reliably prevent reduction in reliability by oxidation of the metal foil, while also allowing fabrication of a flexible laminated sheet via safer steps.

In the drying step, the varnish is preferably heated to 100-170° C. for removal of the solvent. The metal foil is preferably a copper foil.

The invention provides a flexible laminated sheet comprising one or more laminated bodies each having a metal foil formed on one side of a resin film, wherein the content of metal elements in the resin film is no greater than 5 wt %. The metal foil-clad flexible laminated sheet is obtained by the production processes of the invention described above. The flexible laminated sheet can be used to obtain flexible printed circuit boards exhibiting sufficiently satisfactory dielectric characteristics.

A metal foil-clad flexible laminated sheet of the invention is a flexible laminated sheet obtained by the production processes of the invention described above. The flexible laminated sheet can be used to obtain flexible printed circuit boards with sufficiently high reliability.

The relative permittivity of the resin film in the flexible laminated sheet of the invention is preferably no greater than 3.3 at 5 GHz. This can further increase the reliability of the flexible printed circuit board. The resin film in the flexible laminated sheet of the invention preferably has a relative permittivity of no greater than 3.3 at 5 GHz, a thermal expansion coefficient of no greater than 25 ppm/° C. and a peel strength of the resin film from the resin film is at least 1.2 kN/m. This can further increase the reliability of the flexible printed circuit board.

The flexible printed circuit board of the invention has a conductor pattern formed by removing a portion of the metal foil on the flexible laminated sheet of the invention. Alternatively, the flexible printed circuit board of the invention may be a one obtainable by removing the metal foil and forming a conductor pattern on the exposed resin film. Such flexible printed circuit boards have sufficiently high reliability since they are produced using a flexible laminated sheet of the invention as described above.

Effect of the Invention

According to the invention there is provided a process for production of a flexible laminated sheet that can be used to fabricate flexible printed circuit boards that exhibit satisfactory dielectric characteristics, by comprising a resin film containing a polyimide resin with sufficiently reduced permittivity. Also, the process for production of a flexible laminated sheet according to the invention can be used to produce a flexible laminated sheet that allows manufacturing of flexible printed circuit boards with sufficiently high reliability by simple steps.

EXPLANATION OF SYMBOLS 1a, 1b, 1c: Flexible laminated sheets, 2a, 2b: flexible printed circuit boards, 10: laminated body, 11: resin film, 12: metal foil, 15: adhesive layer, 20: conductive pattern.

BEST MODES FOR CARRYING OUT THE INVENTION

Preferred embodiments of the invention will now be described in detail. However, the present invention is not limited to the embodiments described below.

Figure 1:
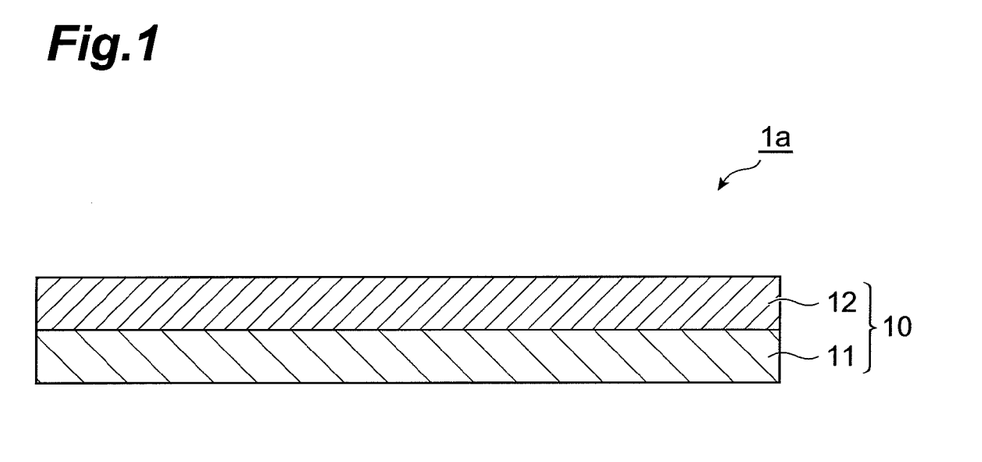
FIG. 1 is a cross-sectional view of an embodiment of a flexible laminated sheet according to the invention.

FIG. 1 is a cross-sectional view of an embodiment of a flexible laminated sheet according to the invention. The flexible laminated sheet 1a shown in FIG. 1 comprises a laminated body 10 formed by bonding a metal foil 12 onto one side of a resin film 11. The thickness of the resin film 11 will normally be about 1-100 μm.

The content of metal elements in the resin film 11 is preferably no greater than 5 wt %. If the content exceeds 5 wt %, the permittivity of the resin film 11 will tend to be too high for practical use. In particular, a metal element content of greater than 10 wt % will notably impair the electrical characteristics including the dielectric characteristic of the flexible printed circuit board. Therefore, from the viewpoint of more reliably maintaining the electrical characteristics of the flexible printed circuit board, the metal element content is preferably no greater than 5 wt %. This tendency is more pronounced when the metal foil 12 is a copper foil. While a lower metal element content is preferred, the lower limit will usually be about 2 wt %.

The metal element content of the resin film 11 can be measured by X-ray Photoelectron Spectroscopy (XPS). The measurements referred to throughout the present specification are all preceded by removal of the metal foil 12 from the resin film 11. Then, argon etching is carried out from the side of the resin film 11 in contact with the metal foil, to a prescribed depth in the direction of thickness. Next, an ESCA5400 X-ray photoelectron spectrometer (trade name of Ulvac-Phi, Inc.) is used for measurement of the quantity of metal elements in the surface exposed by etching. Argon etching is then continued to the next prescribed depth, and the metal element quantity is measured in the same manner. The procedure is repeated until the metal element quantity reaches the detection limit. Finally, the metal element quantity with respect to the total resin film 11 is calculated from the metal element quantity at each depth, and the content is calculated therefrom.

The relative permittivity of the resin film 11 at 5 GHz is preferably no greater than 3.3. The relative permittivity is an index of the insulating property of the resin film, and in cases where the pitch between copper wirings is narrowed or the interlayer thickness is reduced as means for achieving miniaturization and high density of electronic devices, it is preferred for the relative permittivity of the resin film to be a small value. Electronic devices must be operated at high frequency, and a low relative permittivity in the gigahertz band is especially preferred.

The relative permittivity of the resin film 11 can be easily measured by a method using a resonant cavity perturbation complex permittivity evaluator (hereinafter referred to as "cavity resonator"). When the relative permittivity is measured using a cavity resonator, such as a "CP511" (trade name of Kantoh Electronics Application and Development Inc.), measurement may be performed with three test resin films having a thickness of 0.6 mm, a width of 1.8 mm and a length of 80 mm, and the mean value recorded as the relative permittivity. In cases where the thickness of the test films is insufficient, a plurality of resin films may be stacked to ensure that the prescribed thickness is obtained.

The coefficient of linear thermal expansion of the resin film 11 is preferably no greater than 25 ppm/°C. and more preferably 10-25 ppm/°C. The coefficient of linear thermal expansion is an index of the heat-dependent elongation percentage of the material, and when two or more different materials are attached, a smaller difference in coefficients of linear thermal expansion of the materials is preferred from the viewpoint of reliability. The coefficient of linear thermal expansion of the metal foil will generally be 10-25 ppm/°C. (for example, 10 ppm/°C. for stainless steel, 20 ppm/°C. for copper alloys or 22 ppm/°C. for aluminum alloys). When resin films with coefficients of linear thermal expansion exceeding 25 ppm/°C. are attached to the metal foils, warping tends to occur upon heating during the attachment or after the attachment, and wiring breakage or molding defects become more likely, thus reducing the reliability.

The coefficient of linear thermal expansion may be conveniently measured by a TMA method. For measurement of the coefficient of linear thermal expansion by TMA, for example, a test piece with a thickness of 0.025 mm, a width of 13 mm and a length of 15 mm may be raised to a temperature of from 50° C. to 300° C. at 10° C./min using a "TMA2940" (trade name of TA Instruments) under a load of 0.5 gf, and then cooled to room temperature and again raised in temperature from 50° C. to 350° C. at 10° C./min under a load of 0.5 gf, at which time the coefficient of linear thermal expansion in the range of 50° C.-250° C. may be calculated to determine the coefficient of linear thermal expansion.

The peel strength of the metal foil from the resin film is preferably at least 1.2 kN/m. The peel strength of the metal foil from the resin film, i.e. the adhesive force, is related to the reliability when wiring is formed by etching or the like. For improved reliability, it is desirable that no peeling or wire breakage occur under the stress of repeated bending or with thermal history. The peel strength is the maximum value of stress at which the metal foil of a test piece with a thickness of 0.025 mm and a width of 10 mm peels from the main side of the resin film at an angle of 90 degrees.

The present inventors measured metal element contents and relative permittivities by the methods described above. However, values measured by methods under different conditions including different apparatuses and different test piece shapes can be compared if compensation is made.

As the metal foil 12 there may be suitably used foils of copper, aluminum, iron, gold, silver, nickel palladium, chromium and molybdenum or their alloys. Copper foil is preferred among the above. In order to increase the adhesive force with the resin film 11, the surface may be mechanically or chemically treated by chemical roughening, corona discharge, sanding, plating or treatment with aluminum alcoholate, aluminum chelate or silane coupling agents.

The flexible laminated sheet 1a is obtained by a production process comprising a coating step in which a varnish containing a polyamic acid and a solvent is coated onto the metal foil 12 to form a coated film, a holding step in which the coated film formed on the metal foil is held, a drying step in which at least a portion of the solvent in the varnish is removed to form a layer composed of a resin composition (hereinafter referred to as "resin composition layer"), and a resin film-forming step in which the resin composition layer is heated to form a resin film 11 containing a polyimide resin, wherein the conditions for each step after the coating step up to the resin film-forming step are adjusted based on a target for the content of metal elements in the resin film 11.

Alternatively, the flexible laminated sheet 1a may be produced by a production process comprising a coating step in which a varnish containing a solvent and either polyamic acid as a polyimide resin precursor is coated onto a metal foil, a drying step in which the solvent in the varnish is removed to a proportion of 1-60 wt % of the total, and a resin film-forming step in which the resin composition layer is heated to 250-550° C. under a reducing atmosphere to remove the solvent remaining in the resin composition layer while forming a polyimide resin from the polyamic acid, to form a resin film 12 containing the polyimide resin.

The varnish used in the coating step contains one or more polyamic acids as polyimide resin precursors. The polyamic acid is converted to a polyimide resin by heating primarily in the resin film-forming step.

The concentration of the polyamic acid in the varnish is preferably 8-40 wt %. The viscosity of the varnish is preferably 1-40 Pa·s and more preferably 10-40 Pa·s. If the viscosity of the varnish is outside of this range, defects in appearance such as cissing may result upon coating onto the metal foil, thus tending to lower the film thickness precision.

In the coating step, two or more different varnishes may be coated one after the other. In this case, a separate varnish may be coated onto the coated film formed on the metal foil, and a varnish separate from that on the lower layer may also be coated over the resin composition layer after the drying step or over the resin film after the resin film-forming step.

The polyimide resin is a polymer with imide groups on the main chain, and for example, it contains polymer chains represented by the following general formula (1).

[Chemical Formula 1]

(1)

Polyamic acids contain amide and carboxyl groups and are precursors of polyimide resins. The amide groups and carboxyl groups of a polyamic acid react under heating to form imide groups, thus resulting in conversion to a polyimide resin. For example, the polyamic acid may be a polymer with a polymer chain represented by the following general formula (2).

[Chemical Formula 2]

(2)

In formulas (1) and (2), $R^1$ represents a residue obtained by removing an amino group from a diamine, or a residue obtained by removing an isocyanato group from a diisocyanate, and $R^2$ represents a residue obtained by removing the carboxylic acid derivative portion of an aromatic tetracarboxylic acid derivative. The letter n represents an integer of 1 or greater.

The polyamic acid may be synthesized by reacting a tetracarboxylic acid or its derivative with a diamine and/or diisocyanate.

An aromatic amine is preferred as the diamine. As specific examples of aromatic amines there may be mentioned p-, m- or o-phenylenediamine, 2,4-diaminotoluene, 2,5-diaminotoluene, 2,4-diaminoxylene, diaminodurene, 1,5-diaminonaphthalene, 2,6-diaminonaphthalene, benzidine, 4,4'-diaminoterphenyl, 4,4'''-diaminoquaterphenyl, 4,4'-diaminodiphenylmethane, 1,2-bis(anilino)ethane, 4,4'-diaminodiphenyl ether, diaminodiphenylsulfone, 2,2-bis(p-aminophenyl)propane, 2,2-bis(p-aminophenyl)hexafluoropropane, 2,6-diaminonaphthalene, 3,3-dimethylbenzidine, 3,3'-dimethyl-4,4'-diaminodiphenyl ether, 3,3'-dimethyl-4,4'-diaminodiphenylmethane, diaminotoluene, diaminobenzotrifluoride, 1,4-bis(p-aminophenoxy)benzene, 4,4'-bis(p-aminophenoxy)biphenyl, 2,2'-bis[4-(p-aminophenoxy)phenyl]propane, diaminoanthraquinone, 4,4'-bis(3-aminophenoxyphenyl)diphenylsulfone, 1,3-bis(anilino)hexafluoropropane, 1,4-bis(anilino)octafluorobutane, 1,5-bis(anilino)decafluoropentane, 1,7-bis(anilino)decafluorobutane, 2,2-bis[4-(p-aminophenoxy)phenyl]hexafluoropropane, 2,2-bis[4-(3-aminophenoxy)phenyl]hexafluoropropane, 2,2-bis[4-(2-aminophenoxy)phenyl]hexafluoropropane, 2,2-bis[4-(4-aminophenoxy)-3,5-dimethylphenyl]hexafluoropropane, 2,2-bis[4-(4-aminophenoxy)-3,5-ditrifluoromethylphenyl]hexafluoropropane, p-bis(4-amino-2-trifluoromethylphenoxy)benzene, 4,4'-bis(4-amino-2-trifluoromethylphenoxy)biphenyl, 4,4'-bis(4-amino-3-trifluoromethylphenoxy)biphenyl, 4,4'-bis(4-amino-2-trifluoromethylphenoxy)diphenylsulfone, 4,4'-bis(3-amino-5-trifluoromethylphenoxy)diphenylsulfone and 2,2-bis[4-(4-amino-3-trifluoromethylphenoxy)phenyl]hexafluoropropane.

As diamines there may be mentioned siloxanediamines represented by the following general formula (3). In formula (3), $R^3$ represents a monovalent organic group, $R^4$ represents a divalent organic group and n represents an integer of 1 or greater.

[Chemical Formula 3]

(3)

As diisocyanates there may be mentioned diisocyanates obtained by reaction between diamines and phosgene. As specific examples of isocyanates there may be mentioned aromatic diisocyanates such as tolylene diisocyanate, diphenylmethane diisocyanate, naphthalene diisocyanate, diphenylether diisocyanate and phenylene-1,3-diisocyanate.

As tetracarboxylic acids for reaction with diamines, there may be used ones having two pairs of two adjacent carboxyl groups. As specific examples of tetracarboxylic acids there may be mentioned pyromellitic acid, 2,3,3',4'-tetracarboxydiphenyl, 3,3',4,4'-tetracarboxydiphenyl, 3,3',4,4'-tetracarboxydiphenyl ether, 2,3,3',4'-tetracarboxydiphenyl ether, 3,3',4,4'-tetracarboxybenzophenone, 2,3,3',4'-tetracarboxybenzophenone, 2,3,6,7-tetracarboxynaphthalene, 1,4,5,7-tetracarboxynaphthalene, 1,2,5,6-tetracarboxynaphthalene, 3,3',4,4'-tetracarboxydiphenylmethane, 2,2-bis(3,4-dicarboxyphenyl)propane, 2,2-bis(3,4-dicarboxyphenyl)hexafluoropropane, 3,3',4,4'-tetracarboxydiphenylsulfone, 3,4,9,10-tetracarboxyperylene, 2,2-bis[4-(3,4-dicarboxyphenoxy)phenyl]propane, 2,2-bis[4-(3,4-dicarboxyphenoxy)phenyl]hexafluoropropane, butanetetracarboxylic acid and cyclopentanetetracarboxylic acid. Esters, acid anhydrides and hydrochlorides of these tetracarboxylic acids may also be reacted with diamines.

For reaction between the diamine and tetracarboxylic acid or its derivative, the molar ratio of the diamine or diisocyanate with respect to the tetracarboxylic acid or its derivative is preferably 0.95-1.05. If the ratio is outside of this range for the reaction, the molecular weight of the polyamic acid and the polyimide resin produced therefrom will be reduced tending to result in impaired physical properties of the film which may include film brittleness and a poorly maintained film shape.

The reaction is normally conducted in a solvent such as N-methyl-2-pyrrolidone (NNP), N,N-dimethylformamide (DMF), N,N-dimethylacetamide (DMAc), dimethylsulfoxide (DMSO), dimethyl sulfate, sulfolane, γ-butyrolactone, cresol, phenol, a halogenated phenol, cyclohexane or dioxane. The reaction temperature is preferably 0-200° C.

During the reaction, a modifying compound with a reactive functional group may be added to introduce a crosslinked or ladder structure into the polyimide resin. Such modifying compounds include, for example, compounds represented by the following general formula (4). Modification with such compounds introduces a pyrrolone ring or isoindoloquinazolinedione ring into the polyimide resin.

[Chemical Formula 4]

(4)

In formula (4), $R^5$ represents a 2+x valent aromatic organic group and Z represents $—NH_2$, $—CONH_2$, $—SO_2NH_2$ or $—OH$, at the ortho position with respect to the amino group. The letter x represents 1 or 2.

The modifying compound used may be a compound such as an amine, diamine, dicarboxylic acid, tricarboxylic acid or tetracarboxylic acid derivative that has a polymerizable unsaturated bond. This will result in a crosslinked structured in the polyimide resin. As such compounds there may be mentioned maleic acid, nadic acid, tetrahydrophthalic acid, ethynylaniline and the like.

The varnish may also contain, in addition to the polyamic acid, a polyimide resin produced by partial reaction of the polyamic acid. The varnish may also comprise additional crosslinking components such as epoxy compounds, acrylic compounds, diisocyanate compounds and phenol compounds, and additives such as fillers, particles, coloring materials, leveling agents, coupling agents and the like. However, if the amount of such additional components is greater than the content of the polyimide resin or its precursor, the properties of the resin film 11 may be impaired.

The varnish may be coated on the metal foil using a roll coater, comma coater, knife coater, doctor blade, flow coater, sealed coater, die coater, lip coater or the like. In such cases, the varnish is discharged from a film-forming slit and coated as evenly as possible.

After the varnish has been coated onto the metal foil to form a coated film, the coated film is held for a prescribed time in that state on the metal foil (holding step). The conditions for holding, such as the holding temperature, atmosphere and time, are preferably set so that the content of metal elements in the resin film 11 does not significantly increase the relative permittivity of the resin film 11, and in consideration of production cost and equipment investment. The temperature, atmosphere and time for the holding step are even more preferably set in consideration of all of the aforementioned matters in each of the steps up to the resin film-forming step.

A higher holding temperature and longer holding time may result in a higher metal element content. Also, a more oxidizing atmosphere for the holding atmosphere may result in a higher metal element content than a reducing atmosphere. However, the preferred ranges for the conditions will probably differ depending on the metal foil 12 material and the varnish composition. Thus, the conditions are preferably set after determining the correlation between the metal foil 12 material, the varnish composition and the holding temperature, atmosphere and time, and the metal element content in the resin film 12.

Adjustment of the conditions in the holding step, for example when the temperature for holding is room temperature and the atmosphere is air in order to minimize production cost and equipment investment, will involve adjusting the holding time so that the content of metal elements in the resin film 11 is within the preferred range of no greater than 5 wt %. However, adjustment of the conditions is not limited to this method.

After the coated film has been held for the prescribed time in that state on the metal foil, it is heated at preferably 100-170° C. (more preferably 100-160° C.) to remove the solvent in the varnish to a proportion of 1-60 wt % (more preferably 25-45 wt %) of the total in order to form a resin composition layer (drying step). Here, the heating may be accomplished under a reduced pressure atmosphere or under a reducing atmosphere as described hereunder. If the proportion of solvent after the drying step is lower than 1 wt %, the resin composition layer or resin film will shrink in subsequent steps, often producing warping in the obtained flexible laminated body. If the proportion of solvent after the drying step is higher than 60 wt %, the outer appearance may be impaired due to foaming and the handling property may be reduced due to excess tack, when the layer is heated to form a resin film.

The conditions for the drying step, such as the temperature, atmosphere, pressure and time for drying and the residual amount of solvent in the varnish, are preferably set so that the metal element content in the resin film 11 does not significantly increase the relative permittivity of the resin film 11, in consideration of production cost and equipment investment, and also in consideration of minimizing warping of the flexible laminated body, impairment of the outer appearance of the resin film due to foaming and reduced handling property due to excess tack. The conditions for the drying step are even more preferably set in consideration of all of the aforementioned matters in each of the steps up to the resin film-forming step.

A higher drying temperature and longer drying time may result in a higher metal element content. Also, a more oxidizing atmosphere for the drying atmosphere may result in a higher metal element content than a reducing atmosphere. However, the preferred ranges for the conditions will in most cases differ depending on the metal foil 12 material and the varnish composition. Thus, the conditions are preferably set after determining the correlation between the metal foil 12 material, the varnish composition and the drying temperature, atmosphere, pressure and time, and the metal element content in the resin film 12.

Adjustment of the conditions for the drying step may include, in consideration of minimizing warping of the flexible laminated body, impairment of the outer appearance of the resin film due to foaming and reduced handling property due to excess tack, for example, controlling the drying temperature to 100-170° C. and the residual solvent in the varnish to a range of 1-60 wt % of the total, and when the atmosphere is air, controlling the temperature range and residual solvent so that the metal element content in the resin film 11 is no greater than the preferred limit of 5 wt %. However, adjustment of the conditions is not limited to this method.

Subsequent heating of the resin composition layer forms a resin film 11 containing a polyimide resin (resin film-forming step).

The conditions for the resin film-forming step, such as the temperature, atmosphere and time for formation of the resin film, are preferably set so that the content of metal elements in the resin film 11 does not significantly increase the relative permittivity of the resin film 11, and in general consideration of production cost and equipment investment and of the physical properties of the flexible laminated body or flexible printed circuit board. The conditions for the resin film-forming step are even more preferably set in consideration of all of the aforementioned matters in each of the steps up to the resin film-forming step.

A lower resin film-forming temperature and longer time may result in a higher metal element content. Also, a more oxidizing atmosphere for the resin film-forming atmosphere may result in a higher metal element content than a reducing atmosphere. However, the preferred ranges for the conditions will in most cases differ depending on the metal foil 12 material and the composition of the varnish or resin composition layer. Thus, the conditions are preferably set after determining the correlation between the metal foil 12 material, the composition of the varnish or resin composition layer and the resin film-forming temperature, atmosphere and time, and the metal element content in the resin film 12.

Adjustment of the conditions for the resin film-forming step may include, in consideration of the properties of the flexible laminated body or flexible printed circuit board, for example, controlling the atmosphere so that the metal element content in the resin film 11 is no greater than the preferred limit of 5 wt % when the heating temperature is controlled to a range of 250-550° C. Specifically, the adjustment is preferably carried out in the following manner, with the understanding that adjustment of the conditions is not limited to this method.

Preferably, heating is carried out to 250-550° C. (more preferably 250-400° C.) under a reducing atmosphere in the resin film-forming step to form a polyimide resin-containing resin film 12. The solvent remaining in the resin composition layer is removed in the resin film-forming step. However, it is sufficient if the solvent is essentially removed, and the flexible laminated sheet or flexible printed circuit board may contain a trace amount of residual solvent so long as the properties are not impaired. When the varnish and resin composition layer contain a polyamic acid, heating in the resin film-forming step produces a polyimide resin from the polyamic acid.

A reducing atmosphere is an atmosphere formed from a mixed gas of essentially an inert gas and a reducing gas. The mixed gas preferably contains substantially no oxygen, and specifically the mixed gas preferably has an oxygen concentration of no greater than 5 vol %. Adequate management of the oxygen concentration with an oxygen densitometer in the resin film-forming step is important for quality and safety.

The inert gas may be helium, neon, argon, nitrogen, or a mixture thereof. Nitrogen gas is preferred among the above from the viewpoint of convenient manageability. Hydrogen gas is preferred as a reducing gas.

The reducing atmosphere is most preferably one formed by a mixed gas composed of nitrogen gas and hydrogen gas at between 0.1 vol % and 4 vol % of the total. If the hydrogen gas concentration is less than 0.1 vol % the effect of the invention will tend to be reduced, and if it is greater than 4 vol % the lower explosive limit for hydrogen gas may be exceeded. For further improved reliability, the concentration of hydrogen gas in the mixed gas is more preferably between 0.1 vol % and 1 vol %.

Formation of the resin film 11 by heating in a reducing atmosphere prevents oxidation of the polyimide resin. It will also allow control of migration of metal elements from the metal foil 12 into the resin film 11, so that a resin film with high reliability can be obtained. Another advantage is that coloration of the resin film is prevented and workability during the process is improved.

Migration of metal elements during the resin film-forming step is believed to occur upon exposure to an oxygen-containing atmosphere at high temperatures of 200° C. and above. Exposure to an oxygen-containing atmosphere at high temperature promotes oxidation of the metal foil 12 and may lead to instability of the metals on the surface. Moreover, presumably because of the high acidity of the varnish or resin composition, the metals on the surface of the metal foil 12 more readily elute and metal migration takes place. In order to inhibit this phenomenon, it is important to maintain an oxygen-shielded state in the aforementioned reducing atmosphere.

Figure 2:
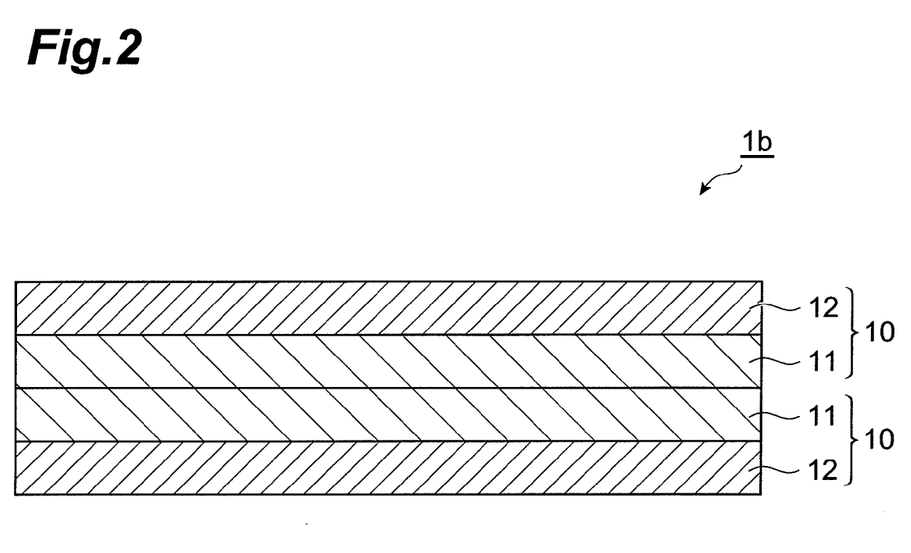
FIG. 2 is a cross-sectional view of an embodiment of a flexible laminated sheet according to the invention.
Figure 3:
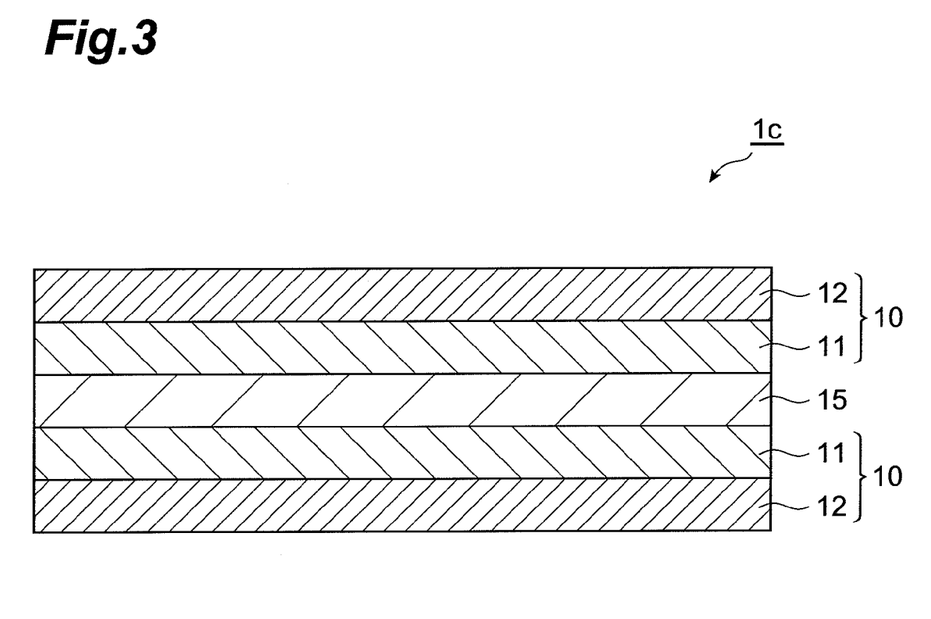
FIG. 3 is a cross-sectional view of an embodiment of a flexible laminated sheet according to the invention.

The flexible laminated sheet of the invention may have a construction different from the flexible laminated sheet 1*a* shown in FIG. 1, such as one obtained by laminating two laminated bodies 10 each comprising a metal foil 12 bonded on one side of a resin film 11, as shown in FIG. 2 or 3.

The flexible laminated sheet 1*b* shown in FIG. 2 has a construction wherein two laminated bodies 10 are laminated with their resin films 11 bonded together. The flexible laminated sheet 1*b* is obtained, for example, by thermocompression bonding of two laminated bodies 10. The method of thermocompression bonding may be a pressing method or laminating method.

The flexible laminated sheet 1c shown in FIG. 3 comprises two laminated bodies 10 and an adhesive layer 15 sandwiched between their resin films 11. That is, the flexible laminated sheet 1c has two laminated bodies 10 bonded with an adhesive. The flexible laminated sheet 1c is obtained, for example, by thermocompression bonding of two laminated bodies 10 having an adhesive sandwiched between them. The adhesive is not particularly restricted so long as it is capable of bonding the resin films. For example, a resin composition containing an epoxy resin, acrylic resin, polyamideimide resin, thermoplastic polyimide resin or the like may be used as the adhesive.

Figure 4:
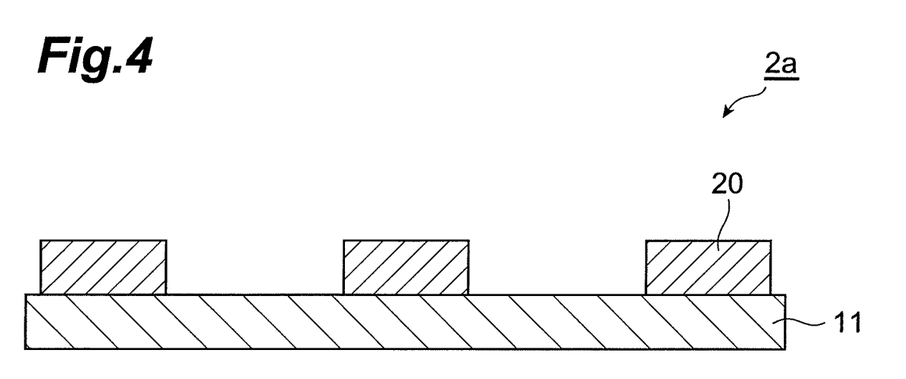
FIG. 4 is a cross-sectional view of an embodiment of a flexible printed circuit board according to the invention.
Figure 5:
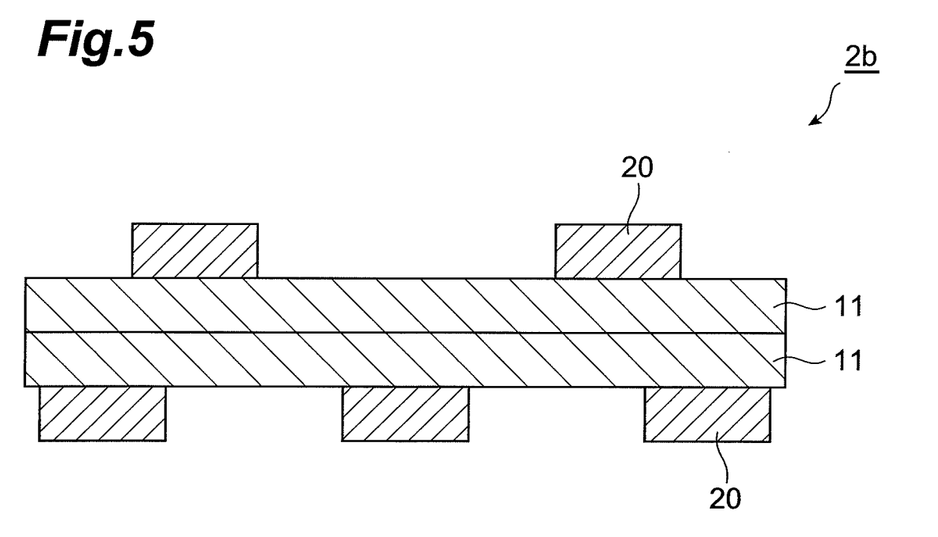
FIG. 5 is a cross-sectional view of an embodiment of a flexible printed circuit board according to the invention.

A flexible printed circuit board may be obtained by a method in which a portion of the metal foil on the flexible laminated sheet is removed to form a conductor pattern. FIGS. 4 and 5 are cross-sectional views of separate embodiments of a flexible printed circuit board according to the invention.

The flexible printed circuit board 2a shown in FIG. 4 is provided with a resin film 11 and a conductor pattern 20 formed on one side of the resin film 11. The conductor pattern 20 is formed by removing portions of the metal foil 12 on the flexible laminated sheet 1a and performing patterning. Patterning of the metal foil 12 may be carried out by a method such as photolithography. Alternatively, the metal foil 12 may be removed from the flexible laminated sheet 1a and electric conductor material directly written onto the exposed resin film 11 to form a conductive pattern, in order to obtain the flexible printed circuit board 2a.

The flexible printed circuit board 2b shown in FIG. 5 is provided with an insulating layer comprising two resin films 11, and a conductive pattern 20 formed on both sides of the insulating layer. The flexible printed circuit board 2b can be produced by the same method as the flexible printed circuit board 2a using the flexible laminated sheet 1b of FIG. 2.

The modes described above are only preferred modes of the invention, and the invention is not limited to these preferred modes. For example, the steps in which the conditions are adjusted based on a target for the content of metal elements in the resin film are not limited to the holding step, drying step and resin film-forming step. When a holding step in which the resin composition layer-formed metal foil is held in that state is carried out between the coating step and resin film-forming step, the temperature, atmosphere and time may be adjusted so that the metal element content is kept within the prescribed numerical range.

EXAMPLES

The present invention will now be explained in greater detail by examples. However, the invention is not limited to these examples.

The relative permittivities, metal element contents, coefficients of linear thermal expansion and metal foil peel strengths of the resin films in the examples and comparative examples were measured according to the following methods.

Relative Permittivity

A rectangular test piece with a width of 2 mm and a length of 80 mm was cut out from the resin film obtained by removing the metal foil of the flexible laminated sheet by etching, and was dried at 105° C. for 30 minutes. A stack of 200 dried test pieces was used to measure the relative permittivity at 5 GHz by a cavity resonator method. Measurement of the relative permittivity was accomplished using a "CP511" cavity resonator by Kantoh Electronics Application and Development Inc. and a "E7350A" network analyzer by Agilent Technologies.

Coefficient of Linear Thermal Expansion

A rectangular test piece with a width of 5 mm and a length of 15 mm was cut out from the resin film obtained by removing the metal foil of the flexible laminated sheet by etching. The test piece was used for measurement of the coefficient of linear thermal expansion in tensile mode. The measurement was performed using a "TMA2940" by TA Instruments, and the coefficient of linear thermal expansion was calculated from the elongation from 50° C. to 250° C.

Metal Element Content

A rectangular test piece with a width of 10 mm and a length of 15 mm was cut out from the resin film obtained by removing the metal foil of the flexible laminated sheet by etching. The metal element content on the main side adjacent to the metal foil of the test piece was measured with an XPS apparatus. Next, argon etching was performed from the main side to a depth of 0.05 μm (approximately 10 minutes), and the metal element content on the exposed side was measured. This was followed by argon etching for approximately 10 minutes and measurement of the metal element content 6 times in the same manner, for a total of 8 metal element content measurements. The metal element content in the resin film was then calculated from the measured metal element contents. The XPS apparatus used was a Model ESCA5400 (trade name of Ulvac-Phi, Inc.).

Metal Foil Peel Strength

The metal foil of the flexible laminated sheet was etched with a 1 mm-wide mask to prepare a test piece with a 1 mm-wide metal foil. The load at which the 1 mm-wide metal foil portion peeled with a peel angle of 90 degrees and a peel rate of 50 mm/min was measured, and the maximum load was recorded as the peel strength.

Synthesis Example

After placing 867.8 g of p-phenylenediamine, 1606.9 g of 4,4'-diaminodiphenyl ether and 40 kg of N-methyl-2-pyrrolidone in a 60 L stainless steel reactor equipped with a thermocouple, stirrer and nitrogen inlet port while circulating approximately 300 mL/min of nitrogen, the mixture was stirred to dissolve the diamine component. The solution was cooled to below 50° C. with a water jacket while slowly adding 4722.2 g of 3,3',4,4'-biphenyltetracarboxylic dianhydride to promote polymerization reaction, thereby obtaining a viscous polyamic acid varnish containing polyamic acid and N-methyl-2-pyrrolidone. In order to improve the coated film workability, it was cooked for 80° C. until the rotating viscosity of the varnish reached 10 Pa·s.

Coating Example 1

The polyamic acid varnish obtained in the synthesis example was coated to a thickness of 50 μm on the roughened surface of a copper foil using a coating machine (comma coater). The copper foil used was a rolled copper foil with a width of 540 mm and a thickness of 12 μm which had been roughened on one side ("BHY-02B-T", trade name of Nikko Materials Co., Ltd.). After holding it in air at room temperature for a prescribed retention time, a forced-draft drying furnace was used to remove the solvent from the polyamic acid varnish coated on the copper foil, to a residual solvent content of 20 wt %, thus forming a resin composition layer containing the polyamic acid.

Coating Example 2

A resin composition layer was formed in the same manner as Coating Example 1, except that the polyamic acid varnish obtained in the synthesis example was coated to a thickness of 50 μm and the solvent was removed from the polyamic acid varnish coated on the copper foil until the proportion of solvent was 50 wt %.

Coating Example 3

A resin composition layer was formed in the same manner as Coating Example 1, except that the polyamic acid varnish obtained in the synthesis example was coated to a thickness of 50 μm and the solvent was removed from the polyamic acid varnish coated on the copper foil until the proportion of solvent was 70 wt %.

Examples 1-6, Comparative Examples 1-3

The resin composition layers formed by the methods of Coating Examples 1-3 were continuously heated using a hot air circulation oven under the heating conditions shown in Table 1 or 2, to fabricate flexible laminated sheets. The relative permittivities, coefficients of linear thermal expansion and metal element contents of the resin films and the peel strengths of the metal foils in the fabricated flexible laminated sheets were measured according to the methods described above. The results are shown in Tables 1 and 2. In the tables, "0.5% hydrogen" means that a nitrogen/hydrogen mixed gas containing 0.5 vol % hydrogen was used. The same applies for "2% hydrogen" and "0.1% hydrogen".

TABLE 1

|  | Example 1 | Example 2 | Example 3 | Example 4 | Example 5 | Example 6 |
|---|---|---|---|---|---|---|
| Resin composition layer formation | Coating Example 1 | Coating Example 1 | Coating Example 1 | Coating Example 1 | Coating Example 1 | Coating Example 2 |
| Heating conditions Atmosphere | Nitrogen/ 0.5% hydrogen | Nitrogen/ 0.5% hydrogen | Nitrogen/ 0.5% hydrogen | Nitrogen/ 2% hydrogen | Nitrogen/ 0.1% hydrogen | Nitrogen/ 0.5% hydrogen |
| Temperature ° C. | 250-400 | 250-300 | 250-550 | 250-400 | 250-400 | 250-400 |
| Relative permittivity | 3.1 | 3.2 | 3.1 | 3.3 | 3.1 | 3.5 |
| Metal element content (wt %) | 3.8 | 2.2 | 3.6 | 4.1 | 4.5 | 3.8 |
| Linear thermal expansion coefficient (ppm/° C.) | 23 | 25 | 22 | 23 | 22 | 22 |
| Copper foil peel strength (kN/m) | 1.4 | 1.2 | 1.2 | 1.3 | 1.4 | 1.5 |

TABLE 2

|  | Comparative Example 1 | Comparative Example 2 | Comparative Example 3 | Comparative Example 4 |
|---|---|---|---|---|
| Resin composition layer formation | Coating Example 1 | Coating Example 1 | Coating Example 1 | Coating Example 3 |
| Heating conditions Atmosphere | Nitrogen | Air | Nitrogen/ 0.5% hydrogen | Nitrogen/ 0.5% hydrogen |
| Temperature ° C. | 250-400 | 250-400 | 200 | 250-400 |
| Relative permittivity | 3.5 | 3.6 | 3.5 | Unmeasurable |
| Metal element content (wt %) | 8.0 | 10.0 | 8.6 | Unmeasurable |
| Linear thermal expansion coefficient (ppm/° C.) | 24 | 27 | 33 | Unmeasurable |
| Copper foil peel strength (kN/m) | 1.5 | 0.8 | 0.9 | Unmeasurable |

As shown in Table 1, the flexible laminated sheets of the Examples exhibited satisfactory properties in terms of relative permittivity, coefficient of linear thermal expansion and copper foil peel strength. In contrast, the flexible laminated sheets of Comparative Examples 1-3 were inadequate in at least one of these properties. In the case of Comparative Example 4, the obtained copper foil-clad flexible laminated body generated significant foaming at the resin film sections and could not produce a copper-clad flexible board material with a satisfactory outer appearance, and therefore evaluation of the relative permittivity and other properties could not be performed.

The invention claimed is:

1. A process for production of a flexible laminated sheet having one or more laminated bodies each provided with a metal foil formed on one side of a resin film, the process comprising:

a coating step in which a varnish containing a polyamic acid and a solvent is coated onto the metal foil to form a coated film;

a holding step in which the coated film formed on the metal foil is held;

a drying step in which at least a portion of the solvent in the varnish is removed to form a layer composed of a resin composition, the solvent in the varnish being removed to a proportion of 1-60 wt % of the total, wherein the drying step is performed subsequent to the holding step; and a resin film-forming step in which the layer composed of the resin composition is heated to form the resin film, the resin film containing a polyimide resin, wherein the process includes adjusting the conditions for each step after the coating step and up to the resin film-forming step so that the content of metal elements in the resin film at a depth of 0.05 μm from a main surface side of the resin film adjacent to the metal foil is no greater than 5 wt % and a relative permittivity of the resin film at 5 GHz is no greater than 3.3.

2. A production process according to claim 1, wherein the layer composed of the resin composition is heated in a reducing atmosphere during the resin film-forming step.

3. A production process according to claim 2, wherein the reducing atmosphere is formed by a mixed gas composed of nitrogen gas and hydrogen gas at between 0.1 vol % and 4 vol % of the total.

4. A production process according to claim 1, wherein the layer composed of the resin composition is heated to 250-550° C. during the resin film-forming step.

5. A production process according to claim 1, wherein the solvent is removed by heating the varnish to 100-170° C. in the drying step.

6. A production process according to claim 1, wherein the metal foil is a copper foil.

7. A production process according to claim 1, wherein in the coating step the varnish is coated in contact with the metal foil.

8. A production process according to claim 1, wherein the resin film-forming step is performed after the drying step.

9. A production process according to claim 1, wherein, in the drying step, the solvent in the varnish is removed to a proportion of 25-45 wt % of the total.

10. A production process according to claim 1, wherein the resin film has a thermal expansion coefficient of no greater than 25 ppm/° C., and a peel strength of the metal foil from the resin film is at least 1.2 kN/m.

* * * * *